United States Patent
Swanson et al.

(10) Patent No.: US 6,441,666 B1
(45) Date of Patent: Aug. 27, 2002

(54) SYSTEM AND METHOD FOR GENERATING CLOCK SIGNALS

(75) Inventors: Vernon W. Swanson, Chippewa Falls, WI (US); Mark Ronald Sikkink, Chippewa Falls, WI (US)

(73) Assignee: Silicon Graphics, Inc., Mountain View, CA (US)

( * ) Notice: Subject to any disclaimer, the term of this patent is extended or adjusted under 35 U.S.C. 154(b) by 0 days.

(21) Appl. No.: 09/620,336

(22) Filed: Jul. 20, 2000

(51) Int. Cl.[7] .................................................. G06F 1/04
(52) U.S. Cl. ...................................... 327/291; 327/115
(58) Field of Search ................................ 327/291, 292, 327/294, 298, 172, 173, 175, 176, 263, 269, 276, 270, 271, 156, 152, 115, 117; 377/47, 48

(56) References Cited

U.S. PATENT DOCUMENTS

| | | | |
|---|---|---|---|
| 3,035,187 A | 5/1962 | Reichert | 307/88.5 |
| 3,594,656 A | 7/1971 | Tsukamoto | 331/49 |
| 3,725,793 A | 4/1973 | Phillips | 328/63 |
| 3,753,241 A | 8/1973 | Bayne | 340/172.5 |
| 3,820,030 A | 6/1974 | Williams | 328/63 |
| 4,118,100 A | 10/1978 | Goell et al. | 350/96.2 |
| 4,165,490 A | 8/1979 | Howe, Jr. et al. | 328/60 |
| 4,218,590 A | 8/1980 | Rasmussen et al. | 179/99 E |
| 4,294,512 A | 10/1981 | Logan | 350/96.2 |
| 4,330,750 A | 5/1982 | Mayor | 328/55 |
| 4,490,821 A | 12/1984 | Lacher | 371/2 |
| 4,504,749 A | 3/1985 | Yoshida | 307/590 |
| 4,514,749 A | 4/1985 | Shoji | 357/68 |
| 4,623,805 A | 11/1986 | Flora et al. | 307/602 |
| 4,627,085 A | 12/1986 | Yuen | 377/81 |
| 4,637,018 A | 1/1987 | Flora et al. | 371/1 |
| 4,675,562 A | 6/1987 | Herlein et al. | 307/602 |
| 4,675,612 A | 6/1987 | Adams et al. | 328/63 |
| 4,696,019 A | 9/1987 | Tulpule et al. | 375/107 |
| 4,713,621 A | * 12/1987 | Nakamura et al. | 327/152 |
| 4,714,924 A | 12/1987 | Ketzler | 340/825.21 |
| 4,737,670 A | 4/1988 | Chan | 307/602 |
| 4,754,164 A | 6/1988 | Flora et al. | 307/269 |
| 4,755,704 A | 7/1988 | Flora et al. | 307/269 |
| 4,756,590 A | 7/1988 | Forrest et al. | 350/96.15 |
| 4,805,195 A | 2/1989 | Keegan | 375/106 |
| 4,818,995 A | 4/1989 | Takahashi et al. | 341/94 |
| 4,833,695 A | 5/1989 | Greub | 375/118 |
| 4,839,604 A | 6/1989 | Tanahashi | 328/62 |
| 4,845,390 A | 7/1989 | Chan | 307/602 |
| 4,851,995 A | 7/1989 | Hsu et al. | 364/200 |
| 4,855,616 A | 8/1989 | Wang et al. | 307/269 |
| 4,860,322 A | 8/1989 | Lloyd | 375/107 |
| 4,864,160 A | 9/1989 | Abdoo | 307/269 |
| 4,868,514 A | 9/1989 | Azevedo et al. | 328/155 |
| 4,881,165 A | 11/1989 | Sager et al. | 364/200 |
| 4,900,115 A | 2/1990 | Heuring et al. | 350/96.15 |
| 4,922,141 A | 5/1990 | Lofgren et al. | 307/595 |
| 4,926,066 A | 5/1990 | Maini et al. | 307/303.1 |
| 4,927,228 A | 5/1990 | Van De Pas | 350/96.2 |
| 4,929,888 A | 5/1990 | Yoshida | 371/25.1 |
| 4,936,504 A | 6/1990 | Arai et al. | 228/190 |
| 4,949,249 A | 8/1990 | Lefsky et al. | 364/200 |
| 4,959,540 A | 9/1990 | Fan et al. | 250/227.12 |

(List continued on next page.)

OTHER PUBLICATIONS

Arena, J., "Evaluating the Limitations of High–Speed Board Testers", 1988 International Test Conference, Paper 22.3, pp. 411–420, (1988).

(List continued on next page.)

*Primary Examiner*—Timothy P. Callahan
*Assistant Examiner*—Linh Nguyen
(74) *Attorney, Agent, or Firm*—Schwegman, Lundberg, Woessner & Kluth

(57) ABSTRACT

A system and method of generating a clock signal as a function of a system clock. A plurality of overlapping phases are generated and two or more of the overlapping phases are combined to form the clock signal.

17 Claims, 13 Drawing Sheets

U.S. PATENT DOCUMENTS

| | | | | |
|---|---|---|---|---|
| 4,999,526 A | | 3/1991 | Dudley | 307/269 |
| 5,008,636 A | | 4/1991 | Markinson et al. | 331/2 |
| 5,043,596 A | | 8/1991 | Masuda et al. | 307/262 |
| 5,049,766 A | | 9/1991 | van Driest et al. | 307/603 |
| 5,087,829 A | * | 2/1992 | Ishibashi et al. | 327/152 |
| 5,087,842 A | | 2/1992 | Pulsipher et al. | 307/603 |
| 5,109,449 A | | 4/1992 | Newberg et al. | 385/46 |
| 5,122,679 A | | 6/1992 | Ishii et al. | 307/269 |
| 5,175,452 A | | 12/1992 | Lupi et al. | 307/591 |
| 5,245,231 A | | 9/1993 | Kocis et al. | 307/606 |
| 5,258,660 A | | 11/1993 | Nelson et al. | 307/269 |
| 5,293,626 A | | 3/1994 | Priest et al. | 395/550 |
| 5,329,188 A | | 7/1994 | Sikkink et al. | 307/517 |
| 5,355,397 A | | 10/1994 | Hanson et al. | 377/56 |
| 5,414,381 A | | 5/1995 | Nelson et al. | 327/262 |
| 5,463,337 A | * | 10/1995 | Leonowich | 327/269 |
| 5,619,170 A | * | 4/1997 | Nakamura | 327/291 |
| 5,909,133 A | * | 6/1999 | Park | 327/269 |
| 6,037,812 A | * | 3/2000 | Gaudet | 327/291 |
| 6,262,609 B1 | * | 7/2001 | Hefaz et al. | 327/156 |

OTHER PUBLICATIONS

Branson, C., et al., "Integrated Pin Electronics for a VLSI System", 1988 International Test Conference, pp. 23–27, (1988).

Friedman, E.G., et al., "Design and Analysis of a Hierarchical Clock Distribution System for Synchronous Standard Cell/Macrocell VLSI", *IEEE Journal of Solid–State Circuits*, SC–21(2), pp. 240–246, (1986).

Hartman, D.H., "Photonic Systems Interconnections—Overcoming the High Speed Electronics Bottleneck", *Hybrid Circuits*, No. 16, pp. 12–18, (1988).

Khalil, R.L., et al., "Optical Clock Distribution for High Speed Computers", *SPIE, vol. 991 Fiber Optic Datecom and Computer Networks*, pp. 32–41, (1988).

Otsuji, T., et al., "A 10–ps Resolution, Process–Insensitive Timing Generator IC", *IEEE Jornal of Solid–State Circuits*, 24(5), pp. 1412–1418, (1989).

Tamana, T., et al., "Key Technologies For 500–MHz VLSI Test System "Ultimate"", International Test Conference, pp. 108–113, (1988).

Wagner, K.D., "Clock System Design", *IEEE Design & Test of Computers*, 5(5), New York, NY, pp. 9–27, (1989).

* cited by examiner

SYSTEM AND METHOD FOR GENERATING CLOCK SIGNALS

FIELD OF THE INVENTION

The present invention is related to clock generators, and more particularly to a system and method for generating a plurality of clocks from a primary oscillator source.

Background Information

High performance computer systems demand high performance clock generation of various frequencies to allow for increased versatility. One clock frequency may be appropriate for one type of memory device; a second may be appropriate for a different type of memory device. Other clock frequencies may be required for network interfaces, or for internal data processing.

At the higher frequencies of operation required in high performance computer systems today, it is extremely important to generate a clocking waveform with low duty cycle and signal distortion. Combinational logic tends to widen the positive pulse of signals. The phase sequencer also tends to widen the positive pulse of signals. These tendencies can contribute to additional duty cycle distortion in the clock controller.

Furthermore, jitter on rising and falling edges can be superimposed on the clocks generated by divide by or by phase lock loop clock generation schemes, further distorting the generated clock signal.

In addition, in some clocking schemes, duty cycle distortion of the oscillator source is reflected directly onto the generated waveform.

What is needed is a system and method for generating a plurality of clocks from a primary oscillator source which avoids these problems and which generates a clock signal with substantially reduced duty cycle distortion.

SUMMARY OF THE INVENTION

According to one aspect of the present invention, a system and method of generating a clock signal as a function of a system clock is described. A plurality of overlapping phases are generated and two or more of the overlapping phases are combined to form the clock signal.

According to another aspect of the present invention, a clock generator includes a phase sequencer and clock generation logic. The phase sequencer is clocked by a first clock signal at a first frequency in order to generate a plurality of overlapping phases. The clock generation logic combines two or more of the overlapping pulses to form a second clock signal, wherein the second clock signal is synchronized to the first clock signal.

According to yet another aspect of the present invention, a system and method of generating a clock signal as a function of a system clock is described. A plurality of overlapping phases, including a first and a second phase, are generated and the first and second phases are combined to form the clock signal, wherein combining includes delaying the first phase in relation to the second phase in order to reduce the duty cycle of the clock signal.

According to yet another aspect of the present invention, a system and method of generating a clock signal as a function of a system clock is described. A plurality of overlapping phases, including a first and a second phase, are generated and the first and second phases are combined to form the clock signal, wherein combining includes delaying the second phase in relation to the first phase in order to increase the duty cycle of the clock signal.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural changes may be made without departing from the scope of the present invention.

Some portions of the detailed descriptions which follow are presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the following discussions, terms such as "processing" or "computing" or "calculating" or "determining" or "displaying" or the like, refer to the action and processes of a computer system, or similar computing device, that manipulates and transforms data represented as physical (e.g., electronic) quantities within the computer system's registers and memories into other data similarly represented as physical quantities within the computer system memories or registers or other such information storage, transmission or display devices.

Figure 1:
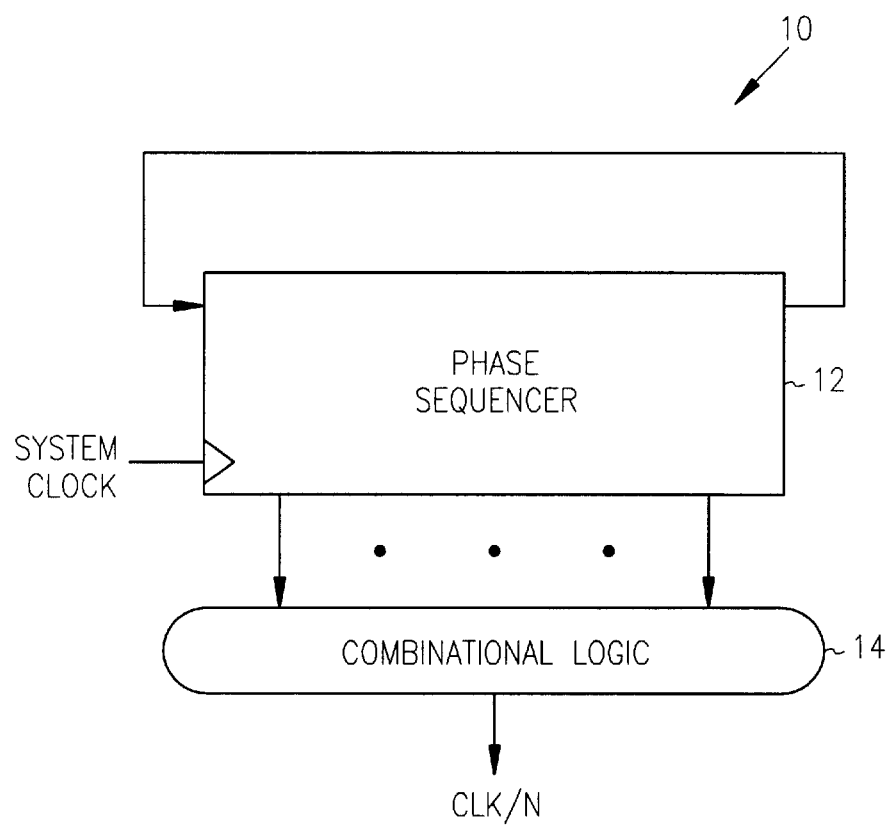
FIG. 1 illustrates a clock generator.

A clock generator 10 is shown in FIG. 1. Clock generator 10 includes a phase sequencer 12 and combination logic 14. Phase sequencer 12 receives a system clock and outputs two or more phases of that system clock. Combinational logic 14 takes one or more of the phases generated by phase sequencer 12 and generates a composite waveform having a frequency which is a function of the system clock.

Figure 2:
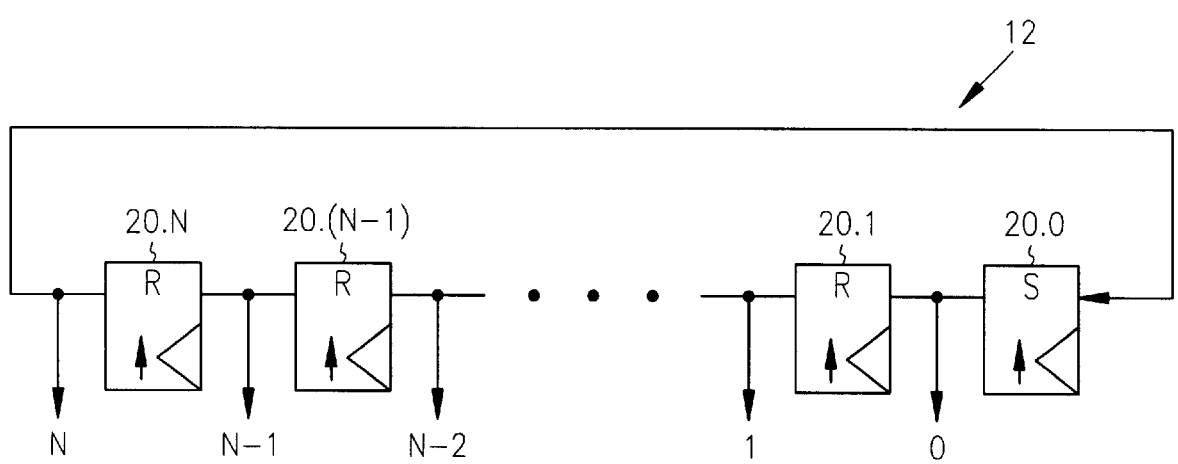
FIG. 2 illustrates a phase sequencer which can be used in the clock generator of FIG. 1.

One embodiment of a phase sequencer 12 is shown in FIG. 2. In the phase sequencer in FIG. 2, N+1 sequencer stages 20 are connected in series and clocked with the system clock. In one such embodiment, a single logic one is propagated down through the chain of sequencer stages 20 from sequencer stage 20.0 through 20.N and then wrapped back around to sequencer stage 20.0 again. The result is a series of pulses repeating over a period of N cycles of the system clock.

Figure 3:
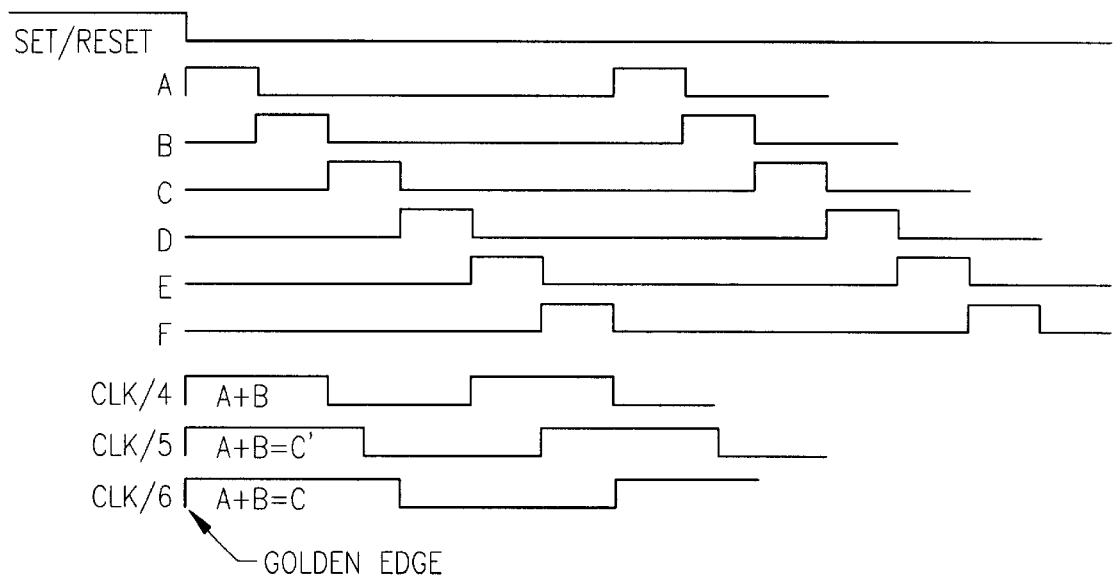
FIG. 3 shows a waveform illustrative of composite clocks generated by the clock generator of FIG. 1.

A representative waveform for N=5 is shown in FIG. 3. FIG. 3 also shows how combinations of pulses can be used to generate clocks having periods of four, five and six times the period of the system clock. A reset signal is used to establish a "golden edge" synchronizing the different clocks.

In one embodiment, each stage 20 is a flip-flop clocked with the system clock.

Figure 4:
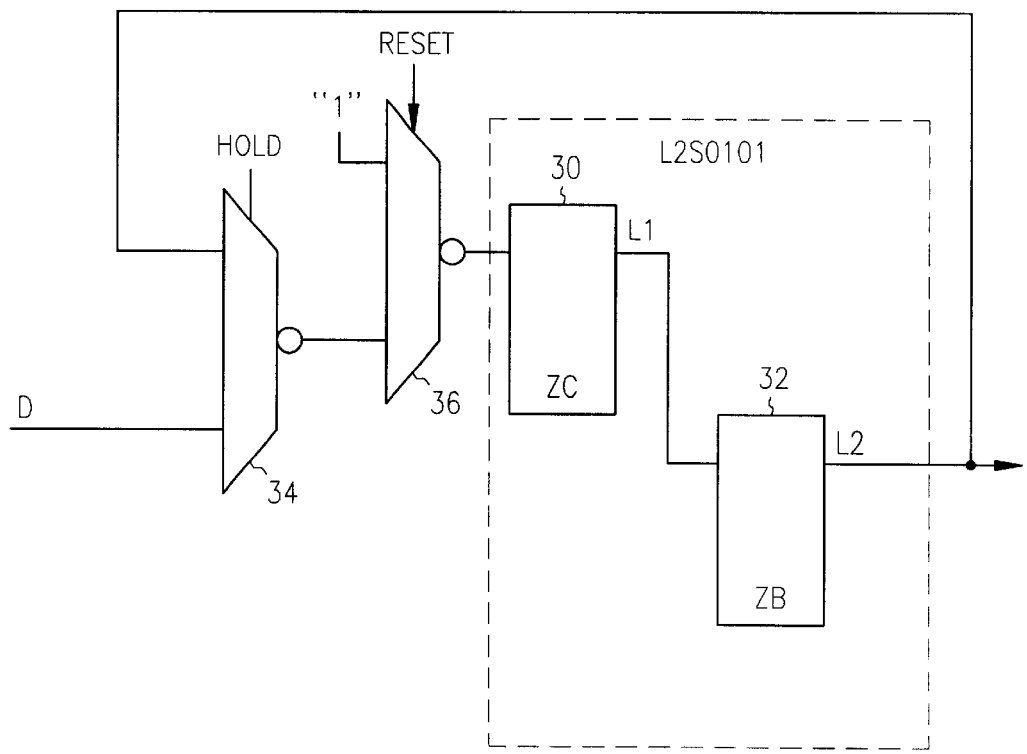
FIG. 4 illustrates a stage of the phase sequencer of FIG. 2.
Figure 5:
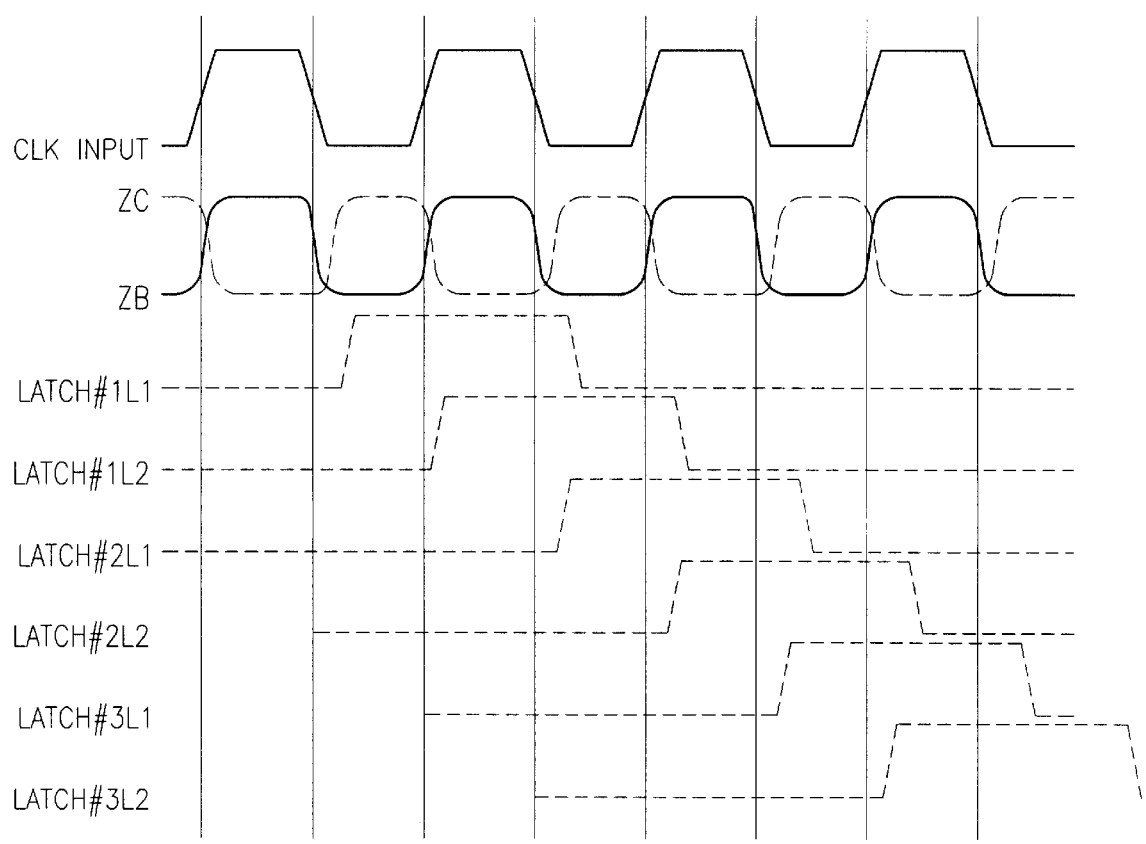
FIG. 5 illustrates operation of one embodiment of the phase sequencer of FIG. 2.

In another embodiment, each stage 20 includes a pair of flip-flops in series. One such sequencer stage 20 is shown in FIG. 4. Stage 20 in FIG. 4 includes flip-flops 30 and 32 connected in series. In the embodiment shown in FIG. 4, flip-flops 30 and 32 are connected in series and are clocked by clocks ZC and ZB, respectively. ZB and ZC are true and complement versions, respectively, of the system clock (see FIG. 5). In such an embodiment, combinational logic 14 uses a combination of the L1 and L2 outputs of each stage 20 to form the composite waveform. In the embodiment shown, L1 is the master and L2 is the slave.

In the embodiment shown in FIG. 4, each stage 20 also includes multiplexers 34 and 36. Multiplexer 34 allows each stage 20 to be placed on "hold" (i.e., continue to reload its current value). Multiplexer 36 allows each stage to be reset to a logic zero. This is useful for initialization of clock generator 10.

Figure 6A:
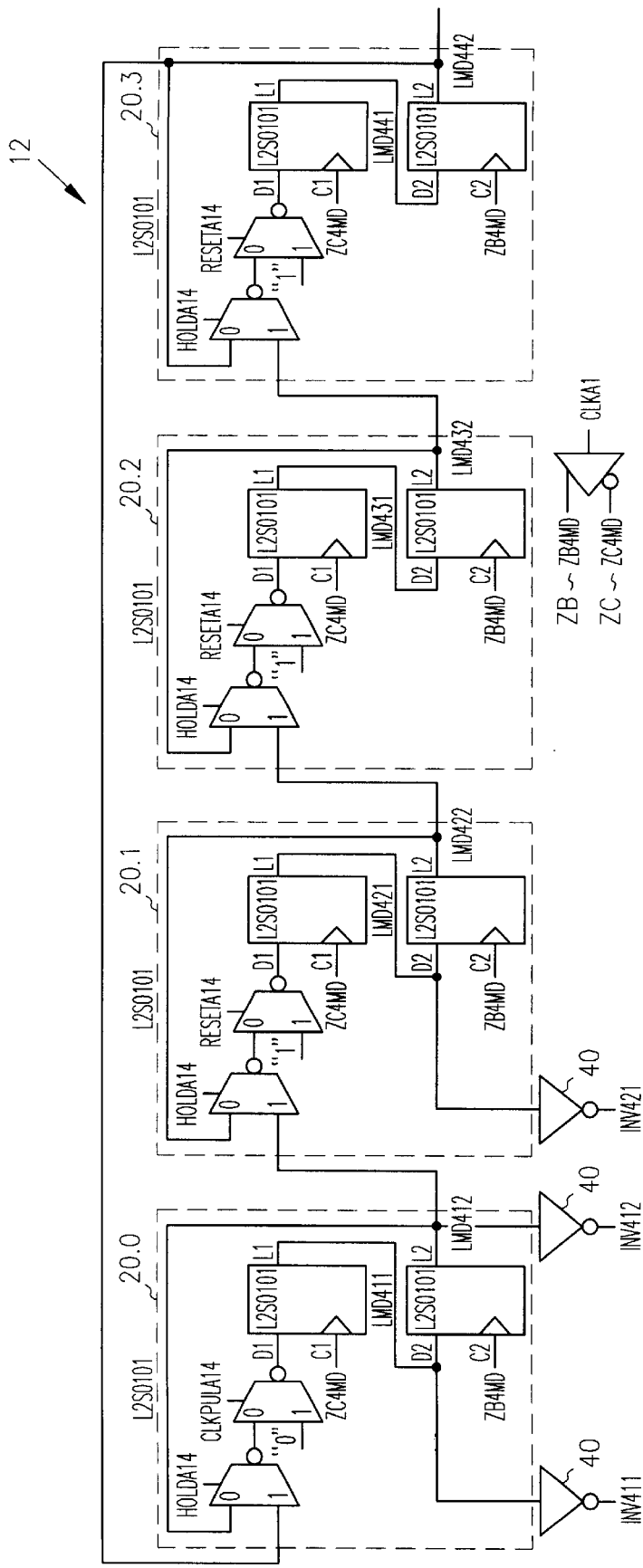
FIGS. 6a–c illustrate various illustrative embodiments of the phase sequencer of FIG. 2.
Figure 6B:
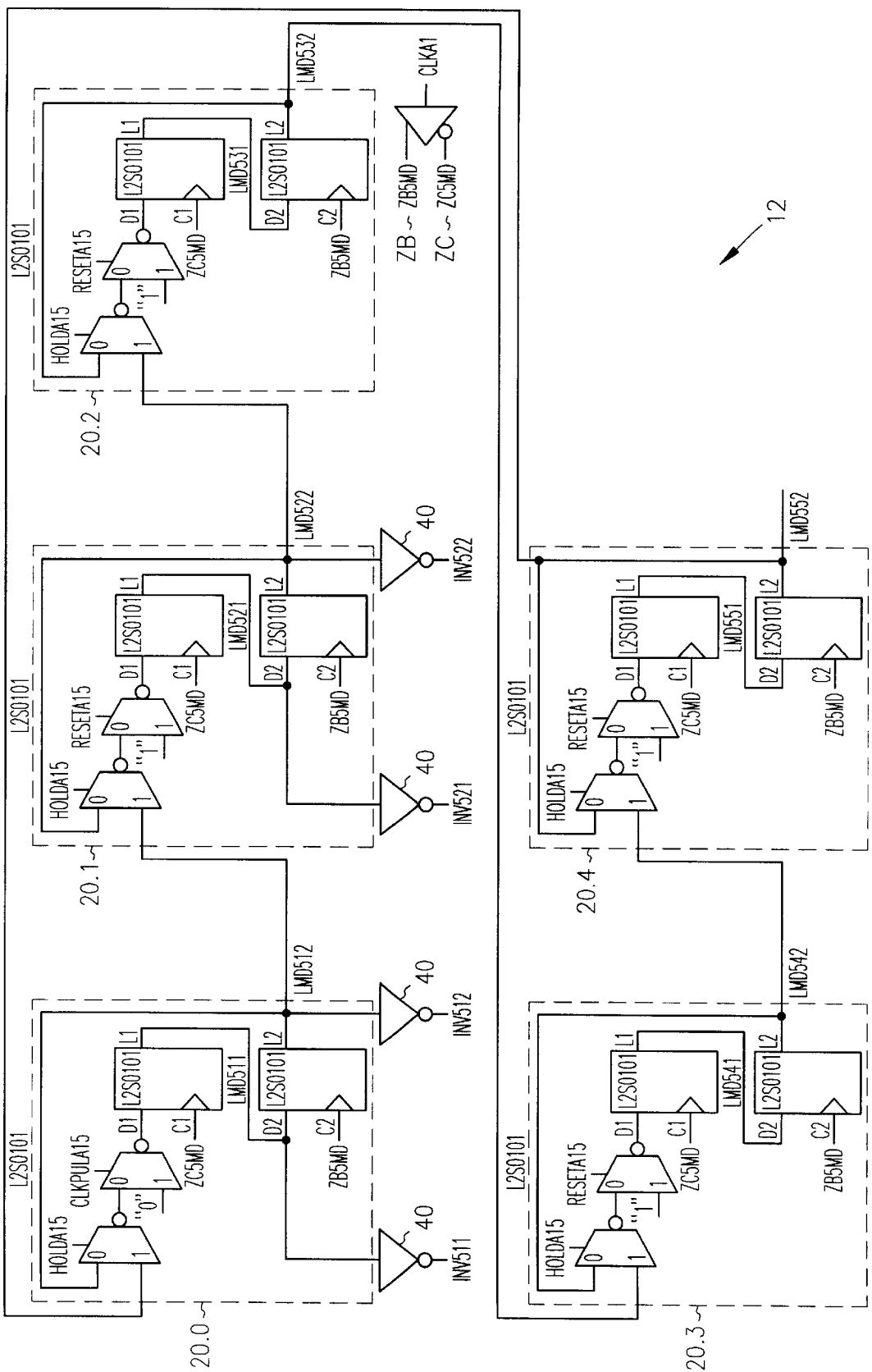
Figure 6C:
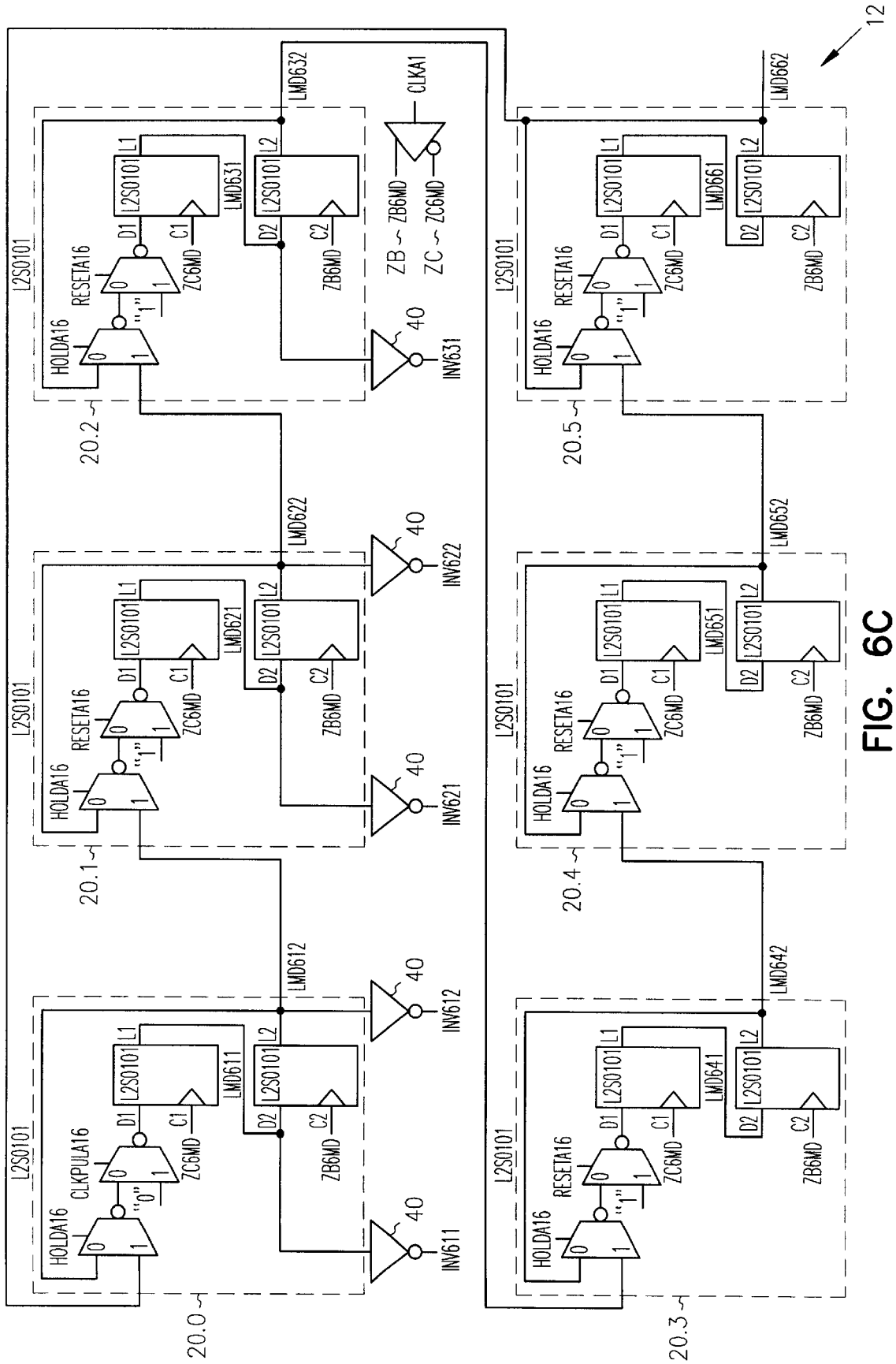

Different embodiments of phase sequencer 12 are shown in FIGS. 6a–6c. For instance, FIG. 6a illustrates a divide-by-4 phase sequencer having four stages 20. Each stage 20 is as shown in FIG. 4.

FIGS. 6b and 6c illustrate divide-by-5 and divide-by-6 phase sequencers, respectively. The divide-by-5 phase sequencer includes five stages 20 while the divide-by-6 phase sequencer includes six stages 20. Again, in the embodiment shown, each stage 20 is as shown in FIG. 4.

In one embodiment, L1 and L2 phases from one or more stages 20 are driven through inverters 40 to combinational logic 14. In one embodiment, L1 and L2 phases are received from inverters 40 in sequencer 12 and are used to generate the appropriate clock waveform. One such approach is shown in FIG. 7.

One of the problems you have in generating a clock from a phase sequencer 12 such as is shown in FIG. 2 is that you may generate a glitch when adding two or more of the phases together. In the embodiment shown in FIGS. 6 and 7, this problem is avoided by selecting a stage 20 that has both an L1 and an L2 output. This type of sequencer stage 20 produces overlapping phases that can be combined in a glitch-free manner. This approach can be understood in the context of FIG. 7.

Figure 7:
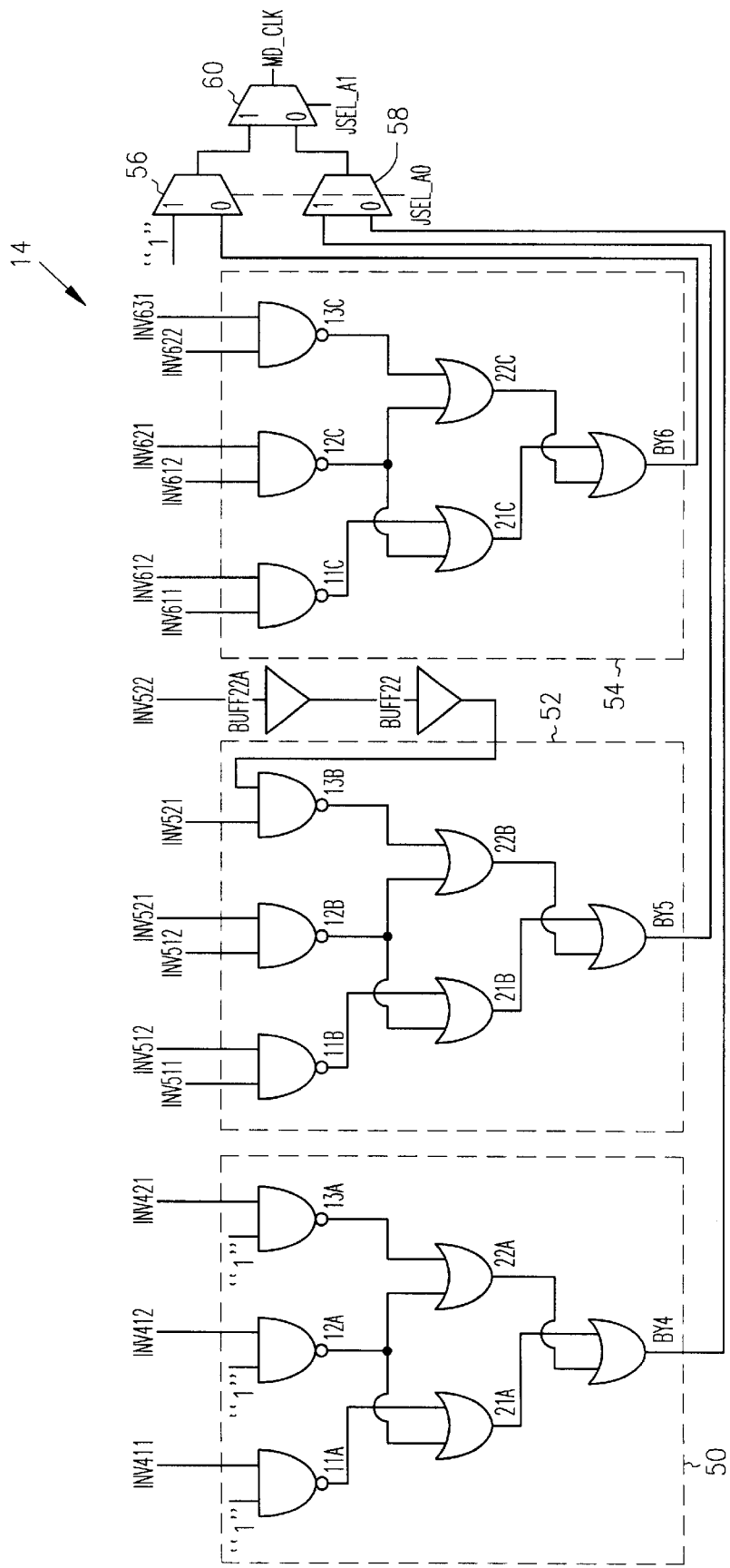
FIG. 7 illustrates combinational logic which can be used with the phase sequencers of FIGS. 6a–c to generate composite clocks.

In the combinational logic 14 of FIG. 7, signals inv411, inv412 and inv421 are processed by combinational logic 50 in order to generate a first clock waveform. Signals inv511, inv512, inv521 and inv522 are processed by combinational logic 52 in order to generate a second clock waveform. Signals inv611, inv612, inv621, inv622 and inv631 are processed by combinational logic 54 in order to generate a third clock waveform. The desired output waveform md_clk is selected from the outputs of combinational logic 50, 52 and 54 through multiplexers 56, 58 and 60.

The approach shown in FIG. 7 is useful when it is desirable to select from three different frequency clocks. Other combinations can be used when it is necessary to select from two clocks or from four or more clocks. For example, it may be advisable to have divide by 4, 5, 6 and 8 clocks. This can easily be accomplished by adding a divide-by-8 phase sequencer 12 and its corresponding logic 14.

The approach shown in FIG. 7 for selecting the desired clock could also be used to select between two or more waveforms of the same frequency clock.

If only a single frequency clock is desired, it can be generated using the desired sequencer 12 and its corresponding combinational logic 14. In situations where both single frequency/waveform clocks are being used in conjunction with selectable clocks or waveforms, the outputs of the single clocks should be routed through two stages of multiplexers (e.g., a combination of multiplexer 56 and 60) in order to match the propagation times of the md_clk signals.

Figure 8:
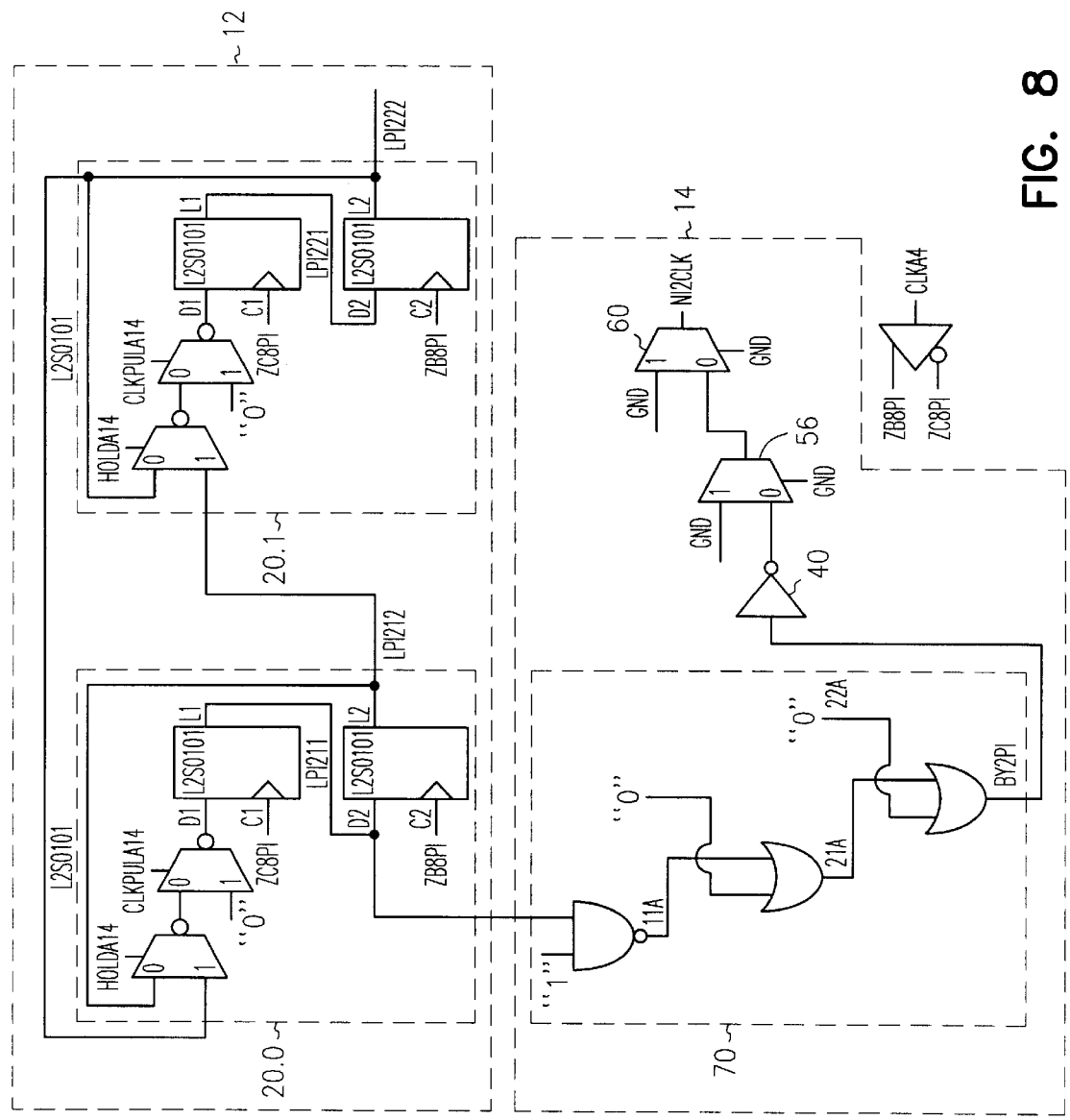
FIG. 8 illustrates another embodiment of the clock generator of FIG. 1.
Figure 9:
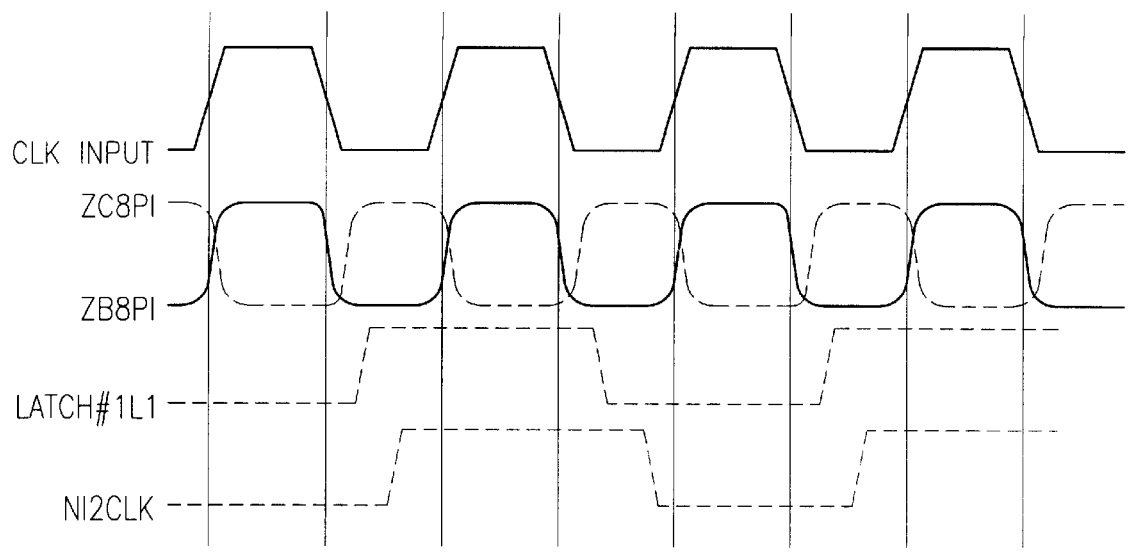
FIG. 9 shows a waveform illustrative of a composite clock generated by the clock generator of FIG. 8.

In one embodiment, a divide-by-2 phase sequencer 12 and its corresponding logic 14 is used to develop a clock at half the frequency of the system clock. One such embodiment is shown in FIG. 8. In the embodiment shown in FIG. 8, only the L1 phase of stage 20.0 is required in order to generate the appropriate clock waveform. The waveform is routed through logic gates 72, 74 and 76 in combination logic 70. Logic gates 72, 74 and 76 have unused inputs hardwired along with multiplexers 56 and 60 to match the latencies of clocks generated, for example, through the combinational logic 14 of FIG. 7. The resulting waveform is illustrated in FIG. 9.

Figure 10:
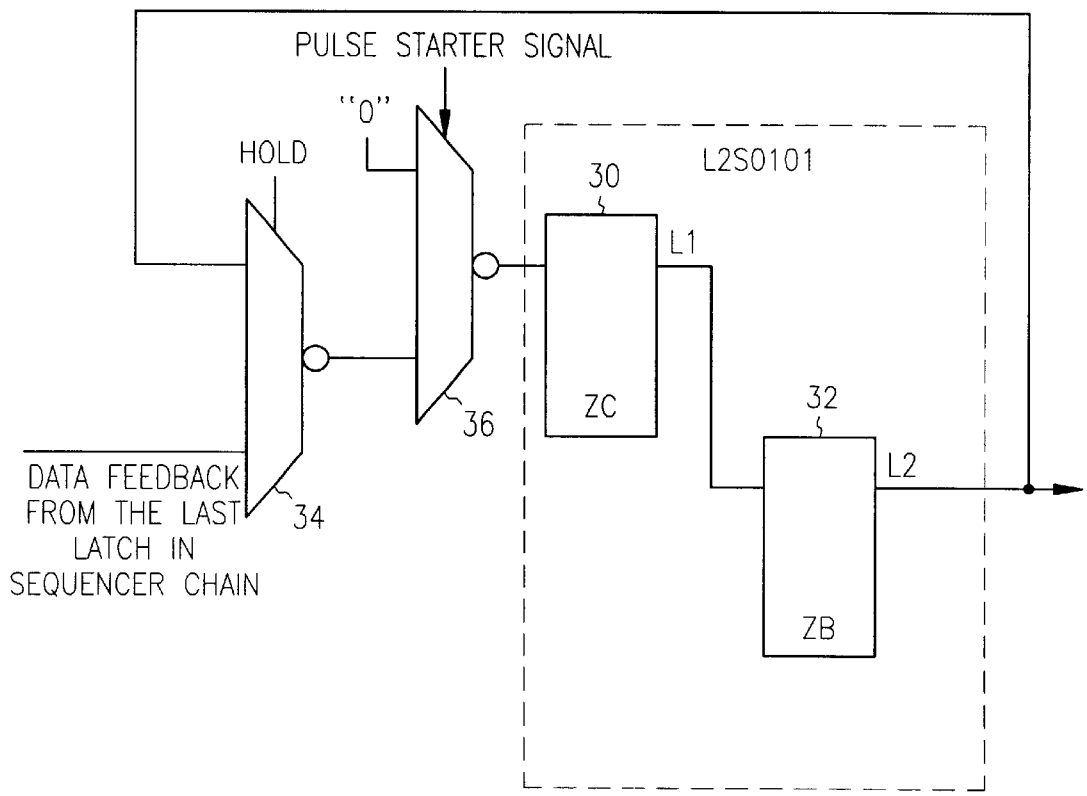
FIG. 10 illustrates one embodiment of the initial stage of a phase sequencer.

In one embodiment, as is shown in FIG. 10, the first sequencer stage 20 is used in conjunction with multiplexers 34 and 36 to provide clock stop and pulse starter capabilities. The path of multiplexer 36 is switched for one system clock period to the "0" port, allowing the hardwired logic zero to pass through and be inverted by inverting multiplexer 36. The resulting logic one is then cycled around stages 20.0 through 20.N until a "HOLD" or reset is asserted.

Figure 11:
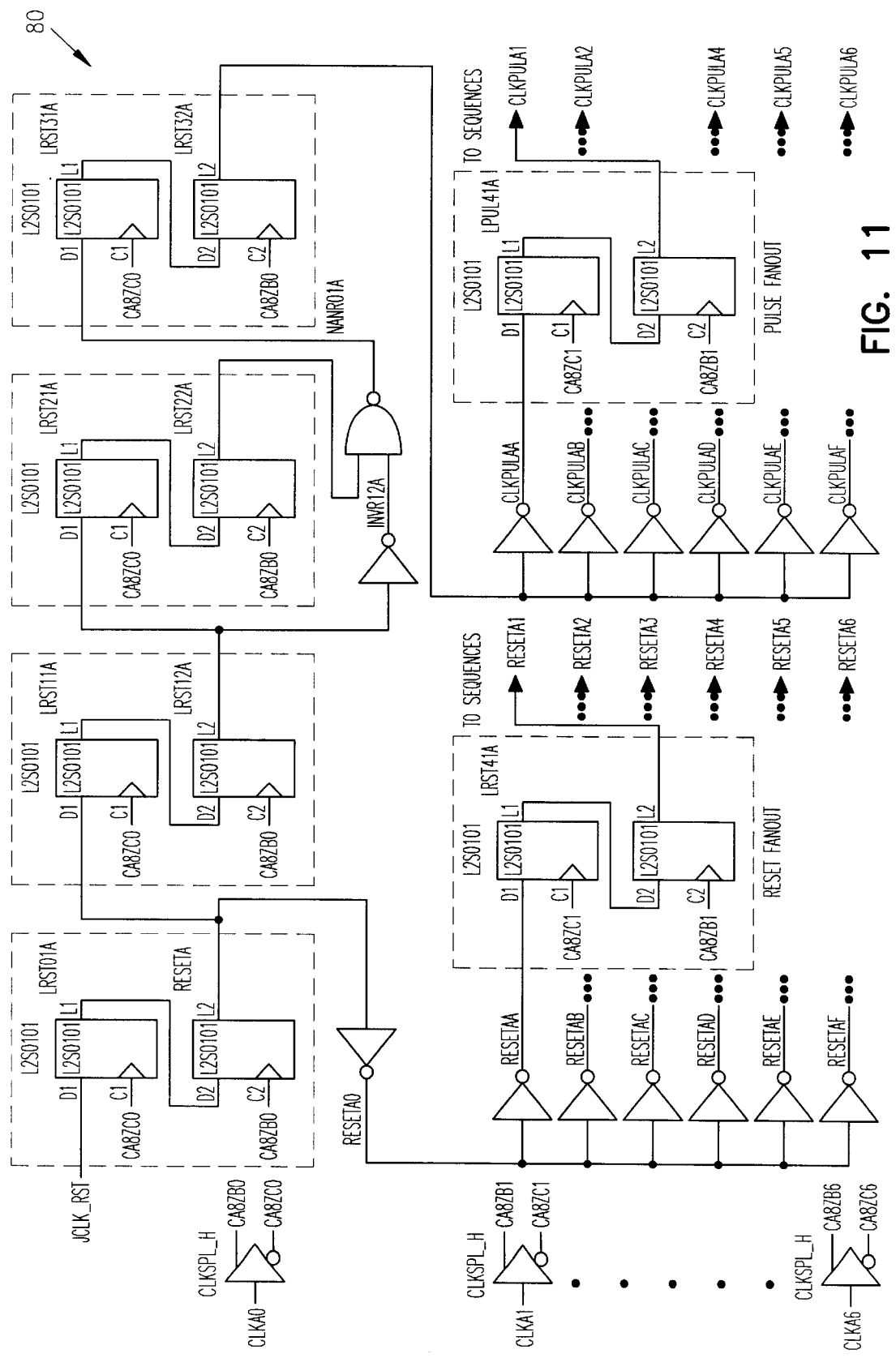
FIG. 11 illustrates a reset and pulse initiator system which can be used with the phase sequencers of FIGS. 6a–c.
Figure 12:
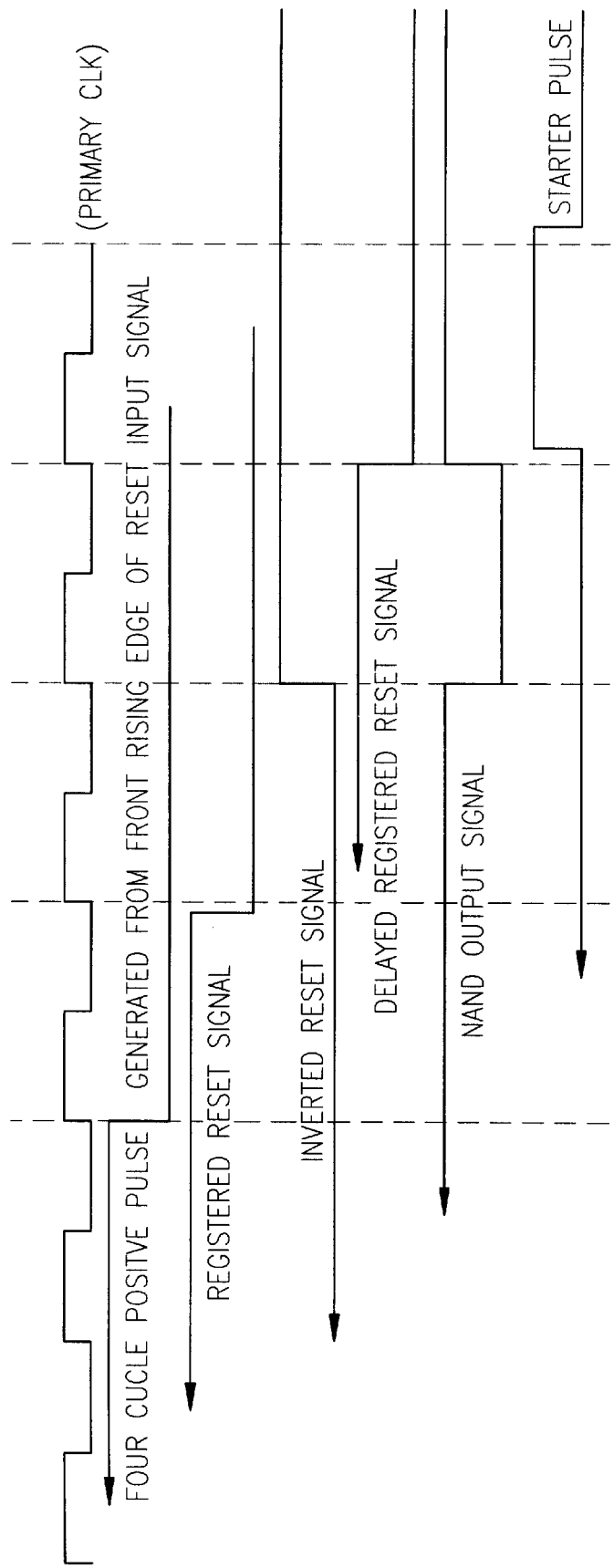
FIG. 12 shows a waveform for performing reset and pulse initiation.

A reset and pulse initiator system 80 which can be used with the phase sequencers 12 described above is shown in FIG. 11. A representative waveform for performing the same function is shown in FIG. 12.

Figure 13:
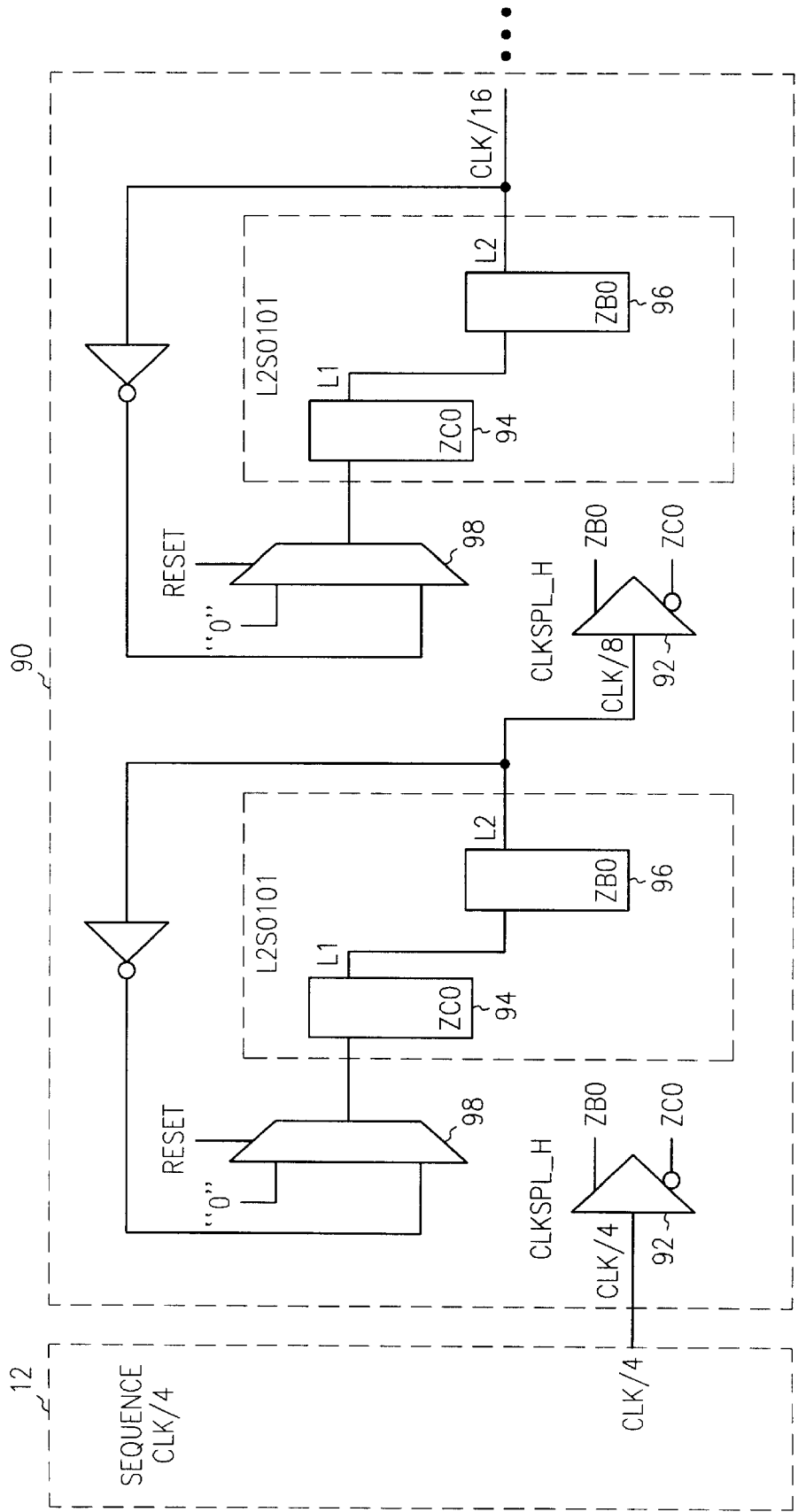
FIG. 13 illustrates a divide-by-$2^N$ circuit.

Similar divide-by schemes can be used to derive slower clocks with clock generator 10. One circuit 90 for generating clocks having period of eight and sixteen system clock periods is shown in FIG. 13. In FIG. 13, a divide-by-four phase sequencer 12 drives a clock driver 92. Clock driver 92, in turn, provides clock signals ZC and ZB for flip-flops 94 and 96. Flip-flops 94 and 96 are connected in series and latch data on different phases of clk/4. A RESET line connected to multiplexer 98 allows generator 10 to switch the selected input of multiplexer 98 is switched for one system clock period to the "0" port, allowing the hardwired logic zero to pass through. The resulting logic zero one is then cycled through flip-flops 94 and 96, inverter 99 and multiplexer 98 until a reset is asserted. The same circuit can be used to generate a divide-by- 16 or any other divide-by-$2^N$ in the manner shown in FIG. 13.

Figure 14:
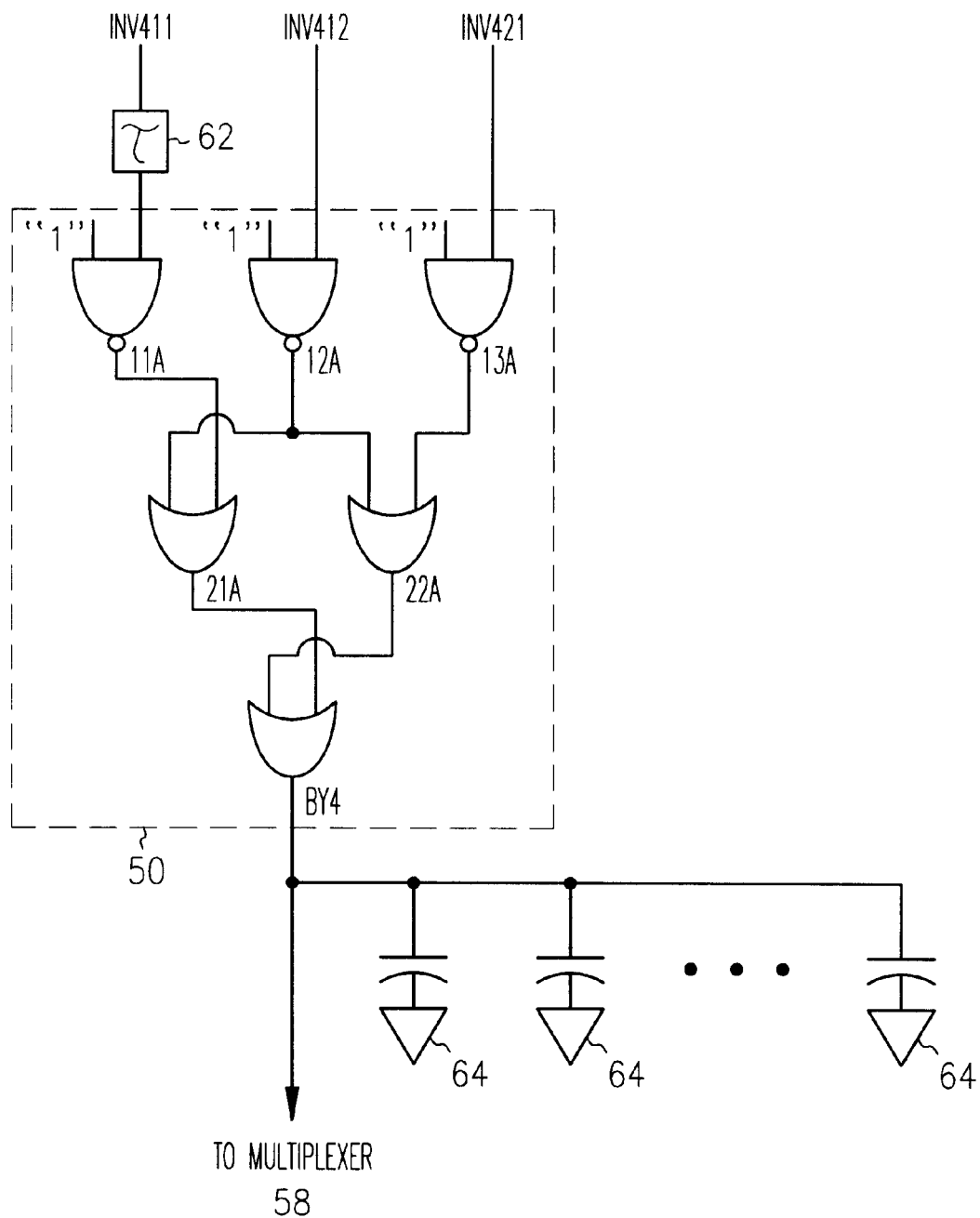
FIG. 14 illustrates passive duty cycle correction.

As noted above, pulses can undergo pulse widening as they travel through a system. Usually, the logic has a faster edge going up and a slower edge going down. This can lead to pulse widening as the signal passes through two or more levels of logic. In one embodiment, this is compensated for by adding delay to the initial edge of the composite clock waveform. In one such embodiment, delay in the form of balanced inverters is added to the first phase being used. In one embodiment, enough delay is added to reduce the duty cycle of the clock signal to less than 50%. This process is termed passive duty cycle compensation. Passive duty cycle compensation could, for example, be added to combination logic 14 of FIG. 7 simply by placing one or more balanced inverters in the inv411, the inv511 or the inv611 signal paths. An example of this is shown in FIG. 14, where a delay 62 has been introduced into the path of inv411.

In one embodiment, the effects of passive duty cycle compensation can be counteracted by the addition of capacitance on the composite clock's signal line. In one such embodiment, capacitive load taps are used to provide flexibility. One such embodiment is shown in FIG. 14, where capacitive load taps 64 provide the ability to stretch the back end of the clk/4 clock pulse.

In one embodiment, if four taps 64 result in a perfect 50% duty cycle during circuit simulation, eight taps 64 are designed into logic 14. Each tap 64 may be designed, for example, to add ten picoseconds. After the integrated circuit containing clock generator 10 is synthesized, the duty cycle of each clock signal is simulated and a decision is made whether to add or subtract capacitive loads. The circuit is then wire-masked with the desired taps 64 and sent to production.

CONCLUSION

Clock generator 0 generates clock and reference pulse signals by the logical combination of phases from a primary oscillator source. Overlapping phases are generated by a phase sequencer circuit. The overlapping sequencer circuit phases are then used to form a variety of glitch-free composite clock and pulse waveforms. In one embodiment, a passive duty cycle correction scheme is used to correct for the pulse widening characteristics of the phase sequencer circuit.

The clocking waveform in any high performance computer is key to achieving the type of synchronization between timing elements needed to allow data processing to occur. Signal distortion, noise jitter and duty cycle distortion remove valuable time from the clock period, time which a processor could use to increase the number of computations occurring over a period of time. The higher the speed of the clock generation circuit, the more critical the clocking waveform and the clock's signal integrity. As operation frequencies increase, computer designers will be able to rely on the higher clocking integrity of system 10 and the versatility of the design to meet their clocking goals.

In the above discussion and in the attached appendices, the term "computer" is defined to include any digital or analog data processing unit. Examples include any personal computer, workstation, set top box, mainframe, server, supercomputer, laptop or personal digital assistant capable of embodying the inventions described herein.

Exampales of articles comprising computer readable media are floppy disks, hard drives, CD-ROM or DVD media or any other read-write or read-only memory device.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. A clock generator, comprising:
   a phase sequencer clocked by a first clock signal at a first frequency, wherein the phase sequencer generates a plurality of pulse streams, wherein the pulse streams have overlapping pulses, wherein each pulse stream has a period that is at least that of the first clock signal; and
   clock generation logic, wherein the clock generation logic combines two or more of the pulse streams to form a second clock signal having a frequency less than the first frequency, wherein the second clock signal is synchronized to the first clock signal.

2. The clock generator of claim 1, wherein the clock generation logic adds delay to one of the pulse streams, wherein the delay reduces the duty cycle of the second clock signal.

3. The clock generator of claim 2, wherein the clock generation logic adds delay to one of the pulse streams, wherein the delay increases the duty cycle of the second clock signal.

4. A method generating a clock signal as a function of a system clock, comprising:
   generating a plurality of pulse streams, wherein the pulse streams have overlapping pulses, wherein each pulse stream has a period that is at least that of the system clock; and
   combining two or more of the pulse streams to form a clock signal, wherein the clock signal has a frequency less than the system clock.

5. The method of claim 4, wherein the plurality of pulse streams includes a first pulse stream and a second pulse stream and wherein combining includes delaying the first pulse stream in relation to the second pulse stream in order to reduce the duty cycle of the clock signal.

6. The method of claim 5, wherein combining further includes modifying capacitance to modify the duty cycle of the clock signal.

7. The method of claim 4, wherein the plurality of includes a first pulse stream and a second pulse stream and wherein combining includes delaying the second pulse stream in relation to the first pulse stream in order to increase the duty cycle of the clock signal.

8. The method of claim 7, wherein combining further includes modifying capacitance to modify the duty cycle of the clock signal.

9. The clock generator of claim 1, wherein the clock generation logic combines two or more of the overlapping pulse streams to form a third clock signal, wherein the third clock signal has a frequency different from the frequencies of the first and second clock signals, wherein the third clock signal is synchronized to the first clock signal.

10. The clock generator of claim 9, wherein the plurality of overlapping pulse streams includes an offset pulse stream delayed by one-half cycle of the first clock signal, wherein the two or more of the pulse streams combined by the clock generation logic to form the third clock signal includes the offset pulse stream.

11. The clock generator of claim 1, wherein the plurality of overlapping pulse streams includes an offset pulse stream delayed by one-half cycle of the first clock signal, wherein the two or more of the pulse streams combined by the clock generation logic to form the second clock signal includes the offset pulse stream.

12. The clock generator of claim 1, wherein modifying capacitance includes selecting a capacitive load tap.

13. A method generating a clock signal as a function of a system clock, comprising:
   generating a plurality of pulse streams, wherein the pulse streams have overlapping pulses, wherein each pulse stream has a period that is at least that of the system clock, and
   combining two or more of the pulse streams to form a clock signal having a frequency less than that of the system clock, wherein combining includes stopping the first and second pulse streams in order to stop the clock signal.

14. The method of claim 13, wherein the plurality of pulse streams includes a first pulse stream and a second pulse stream and wherein combining includes delaying the first pulse stream in relation to the second pulse stream in order to change the duty cycle of the clock signal.

15. In integrated clock controller having multiple clock domains, the clock controller comprising:
   a phase sequencer clocked by a first clock signal at a first frequency, wherein the phase sequencer generates a plurality of pulse streams, wherein the pulse streams have overlapping pulses, wherein each pulse stream has a period that is at least that of the first clock signal; and
   clock generation logic, wherein the clock generation logic combines the pulse streams to form a second clock signal having a second frequency and a third clock signal having a third frequency, wherein the second frequency is less than the third frequency and the third frequency is less than the first frequency, wherein the second and third clock signals are synchronized to the first clock signal.

16. The clock controller of claim 15, wherein the phase sequencer includes test control logic for stopping and starting the third clock signal.

17. The clock controller of claim 15, wherein the test control logic includes means for selecting a number of pulses, for starting the third clock signal and for stopping the third clock signal after the selected number of pulses.

* * * * *

UNITED STATES PATENT AND TRADEMARK OFFICE
CERTIFICATE OF CORRECTION

PATENT NO. : 6,441,666 B1
DATED : August 27, 2002
INVENTOR(S) : Vernon W. Swanson and Mark R. Sikkink It is certified that error appears in the above-identified patent and that said Letters Patent is hereby corrected as shown below:

<u>Title page,</u>
Item [56], U.S. PATENT DOCUMENTS, insert -- et al. -- after "Reichert".
Insert the following:
-- FOREIGN PATENT DOCUMENTS
87/04306     7/16/1987     PCT     H03K   5/13 --.
Item [74], *Attorney, Agent, or Firm*, insert -- , P.A. -- after "Kluth".

Signed and Sealed this

Fifth Day of August, 2003

JAMES E. ROGAN
*Director of the United States Patent and Trademark Office*